(12) United States Patent
Yamazaki et al.

(10) Patent No.: US 8,734,148 B2
(45) Date of Patent: May 27, 2014

(54) HEAT TREATMENT APPARATUS AND METHOD OF MANUFACTURING SEMICONDUCTOR DEVICE

(75) Inventors: Keishin Yamazaki, Toyama (JP); Akira Hayashida, Toyama (JP); Masaaki Ueno, Toyama (JP); Manabu Izumi, Toyama (JP); Katsuaki Nogami, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 471 days.

(21) Appl. No.: 13/033,974

(22) Filed: Feb. 24, 2011

(65) Prior Publication Data
US 2011/0207339 A1 Aug. 25, 2011

(30) Foreign Application Priority Data
Feb. 25, 2010 (JP) ................................. 2010-039845

(51) Int. Cl.
*F27D 1/00* (2006.01)
(52) U.S. Cl.
USPC ............ 432/245; 432/247; 219/402; 219/409
(58) Field of Classification Search
USPC ............ 432/24, 239, 241, 245, 247; 219/390, 219/402, 408, 409
See application file for complete search history.

(56) References Cited

U.S. PATENT DOCUMENTS

| 5,846,073 | A | * | 12/1998 | Weaver | 432/241 |
| 5,848,889 | A | * | 12/1998 | Tietz et al. | 432/258 |
| 7,311,520 | B2 | | 12/2007 | Saito et al. | |
| 2011/0223693 | A1 | * | 9/2011 | Sugishita | 438/5 |

FOREIGN PATENT DOCUMENTS

| CN | 1685477 | 10/2005 |
| CN | 200832588 | 8/2008 |
| CN | 200834650 | 8/2008 |
| EP | 1 734 564 A1 | 12/2006 |
| JP | 09-219375 A | 8/1997 |
| JP | 10-303099 A | 11/1998 |
| KR | 10-2009-0059539 A | 6/2009 |

* cited by examiner

*Primary Examiner* — Gregory A Wilson
(74) *Attorney, Agent, or Firm* — Volpe And Koenig, P.C.

(57) ABSTRACT

A heat treatment apparatus capable of achieving high-accuracy processing and high safety and a method of manufacturing a substrate are provided. The heat treatment apparatus 10 includes a reaction tube 42 for processing a substrate, a manifold 44 for supporting the reaction tube 42, a heater 46 installed around the reaction tube 42 to heat an inner part of the reaction tube 42, a surrounding member 500 installed to surround a side portion of the reaction tube 42 arranged in a lower portion than the heater 46; an exhaust device 301 for forcibly exhausting a gap 506 between the surrounding member 500 and the reaction tube 42; and a sealing member 150 installed in a contacting portion between the reaction tube 42 and the manifold 44. Here, an inlet hole 501 through which the exhaust device inhales an atmosphere outside the surrounding member 500 to the gap 506 is installed in the surrounding member 500.

6 Claims, 4 Drawing Sheets

HEAT TREATMENT APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2010-039845 filed on Feb. 25, 2010, to the Japanese Patent Office, the entire contents of which are hereby incorporated by reference.

BACKGROUND OF THE INVENTION

1. Field of the Invention

The present invention relates to a heat treatment apparatus for manufacturing a substrate such as a semiconductor wafer, glass, etc., and a method of manufacturing a semiconductor device.

2. Description of the Related Art

As a conventional heat treatment apparatus for thermally treating a substrate, a vertical heat treatment apparatus has been used. The conventional vertical heat treatment apparatus includes a reaction furnace. When a wafer is processed inside the reaction furnace, a predetermined process is performed by heating the wafer to a predetermined temperature under an atmosphere of gases introduced into the sealed reaction furnace.

In this case, the environment (gas purity) of the reaction furnace is critical. In general, the reaction furnace (an inner part of the reaction tube) is controlled so that it can have a negative pressure with respect to the outside (the air) of the reaction furnace. In this case, when a sealing portion (a contacting portion) between the reaction tube and a manifold is leaked, the air flows from the outside to the inside of the reaction furnace. When the air or impurities are mixed into the gas atmosphere in the reaction furnace, it is impossible to perform a desired process, and the processed wafer cannot have desired performance.

Also, when a great quantity of gas temporarily flows into the reaction furnace or a gas exhaust port is closed due to device malfunction, etc., an inner part of the reaction furnace has a positive pressure with respect to the outside of the reaction furnace (atmospheric pressure). In this case, when there is a leak between the reaction tube and the manifold, a processing gas is leaked from the inner part of the reaction furnace to the outside of the reaction furnace. Since the processing gas used in this processing can have risks such as toxicity or explosions, it should not be leaked out of the reaction furnace (the air). That is, a gas should not be leaked from the outside of the reaction furnace to the inner part of the reaction furnace or from the inner part of the reaction furnace to the outside of the reaction furnace.

Accordingly, in order to seal a space between the reaction tube and the manifold as described above, the leakage of the gas from the reaction furnace and the invasion of the external gas from the outside of the reaction furnace are suppressed in the contacting portion by supplying an inert gas to a ring-shaped groove and setting an inner part of the groove to a pressure level (positive pressure) higher than the reaction chamber, for example, the outside of the reaction chamber.

However, since such sealing is incomplete, a large amount of gas may be leaked from the inner part of the reaction furnace, and an external gas may be invaded from the outside of the reaction furnace. Therefore, it is impossible to perform a desired process, or a level of risk may be high.

SUMMARY OF THE INVENTION

An object of the present invention is to provide a heat treatment apparatus capable of solving the prior art problems and achieving high accuracy processing and high safety, and a method of manufacturing a semiconductor device.

According to one embodiment of the present invention, there is provided a heat treatment apparatus including a reaction tube for processing a substrate; a manifold for supporting the reaction tube; a heater installed around the reaction tube to heat an inner part of the reaction tube; a surrounding member installed to surround a side portion of the reaction tube arranged in a lower portion than the heater; an exhaust device for forcibly exhausting a gap between the surrounding member and the reaction tube; and a sealing member installed in a contacting portion between the reaction tube and the manifold, wherein an inlet hole through which the exhaust device inhales an atmosphere outside the surrounding member to the gap is installed in the surrounding member.

According to another embodiment of the present invention, there is provided a method of manufacturing a semiconductor device including loading a substrate into a reaction tube supported by a manifold; thermally treating the substrate in the reaction tube; and unloading the substrate from the reaction tube after the heat treatment, wherein a contacting portion between the reaction tube and the manifold is hermetically sealed by a sealing member, a surrounding member for surrounding a side portion of the reaction tube is installed, an inlet hole is installed in the surrounding member, and an atmosphere between the reaction tube and the surrounding member is forcibly exhausted and inhaled through the inlet hole to the gap during at least the heat treatment process.

In accordance with the present invention, a heat treatment apparatus and a method of manufacturing a semiconductor device with a high-accuracy processing and a high safety are provided.

DETAILED DESCRIPTION OF THE PREFERRED EMBODIMENTS

Next, a first embodiment of the present invention will be described with reference to the accompanying drawings.

Figure 1:
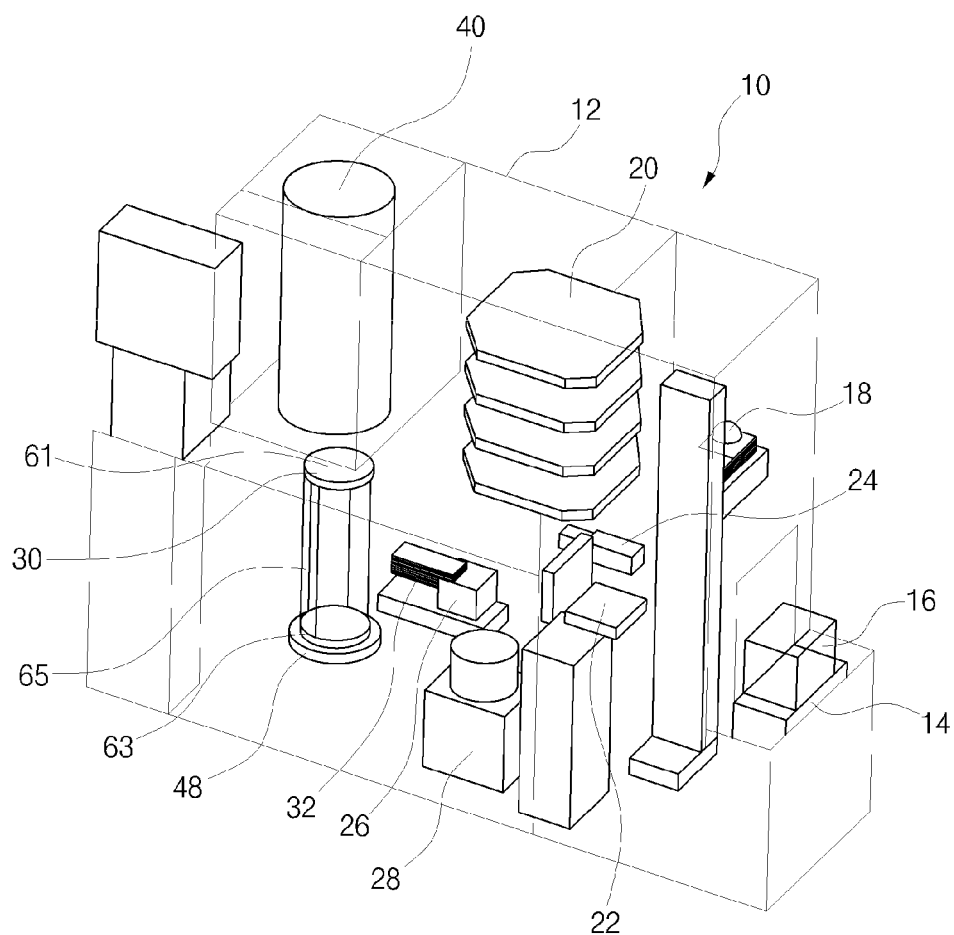
FIG. 1 is a perspective view illustrating a heat treatment apparatus used in a first embodiment of the present invention.

FIG. 1 exemplifies a heat treatment apparatus 10 according to the first embodiment of the present invention. The heat treatment apparatus 10 is a batch-type vertical heat treatment apparatus, and includes a case 12 in which main units are disposed. A pod stage 14 is connected to a front side of the case 12, and a pod 16 is transferred into the pod stage 14. The pod 16 may accommodate, for example, twenty five substrates, and may be set on the pod stage 14 with a lid (not shown) closed.

A pod transfer device 18 is disposed in a position opposite to the pod stage 14 of a front side in the case 12. In addition, a pod shelf 20, a pod opener 22 and a substrate number detector 24 are disposed in the vicinity of the pod transfer device 18. The pod shelf 20 is disposed above the pod opener 22, and the substrate number detector 24 is disposed adjacent to the pod opener 22. The pod transfer device 18 transfers the pod 16 among the pod stage 14 and the pod shelf 20 and the pod opener 22. The pod opener 22 serves to open the lid of the pod 16, and the number of the substrates present inside the pod 16 with the lid open is detected by the substrate number detector 24.

In addition, a substrate transfer unit 26, a notch aligner 28, and a support member 30 (a boat) are disposed inside the case 12. For example, the substrate transfer unit 26 includes an arm 32 (tweezers) capable of unloading five substrates, and the substrate is transferred among the pod 16 placed at the pod opener 22, and the notch aligner 28 and the support member 30 by movement of the arm 32. The notch aligner 28 detects a notch or an orientation flat formed in the substrate and aligns the notch or the orientation flat of the substrate in a certain position.

In addition, a reaction furnace 40 is disposed in the case 12 at an upper rear side thereof. In addition, a boat elevation control unit (not shown) for carrying in (inserting) and carrying out (withdrawing from an inner part of the reaction tube 42) the support member 30 into/from the reaction furnace 40 is arranged at a lower portion of the reaction furnace 40. The support member 30 with the substrates loaded is carried into the reaction furnace 40 by the boat elevation control unit, and the heat treatment is performed.

Figure 2:
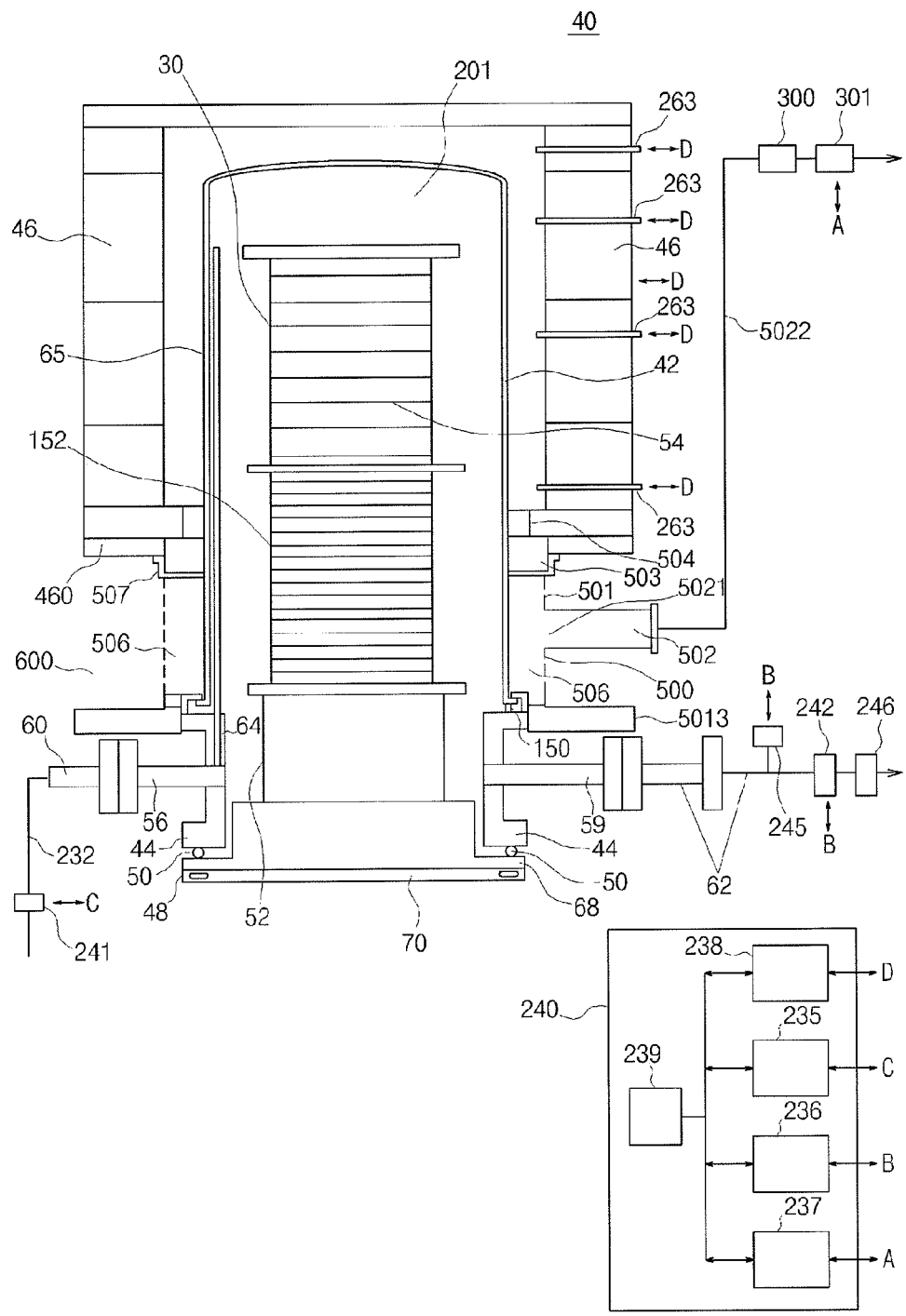
FIG. 2 is a longitudinal cross-sectional view illustrating a reaction furnace used in the first embodiment of the present invention.

FIG. 2 exemplifies the reaction furnace 40 according to the first embodiment. The reaction furnace 40 includes the reaction tube 42 made of silicon carbide (SiC). The reaction tube 42 has a cylindrical shape with its upper end closed and its lower end open. Here, the open lower end has a flange shape. The SiC used for the reaction tube 42, etc. is difficult to be subjected to processes such as cutting a groove due to limits in strength size. In addition, the reaction tube 42 did not undergo the groove processing. The lower end of the reaction tube 42 has the flange shape.

Moreover, a metallic manifold 44 (a furnace port manifold) for supporting the reaction tube 42 is disposed below the reaction tube 42. In addition, the manifold 44 may be made of quartz. The manifold 44 has a cylindrical shape with its upper and lower ends open. Here, each of the open upper and lower ends has the flange shape. An O-ring 150 is interposed as a sealing member between an upper surface of the flange at the upper end of the manifold 44 and a lower surface of the flange at the lower end of the reaction tube 42. A processing chamber 201 is formed by the reaction tube 42 and the manifold 44. In addition, a heater 46 is disposed about an upper portion of the reaction tube 42. The heater 46 heats an inner part of the reaction tube 42. The heater 46 is supported by a heater base 460.

As a temperature detector for detecting an inner temperature of the heater 46, a plurality of temperature sensors 263 are installed in the heater 46. A radiation thermometer or Type R or B thermocouple, etc. is used as the temperature sensors 263. A temperature controller 238 is electrically connected to the heater 46 and the temperature sensors 263, and is configured to control an inner temperature of the processing chamber 201 at a desired timing to have a desired temperature distribution by adjusting an electrification state of the heater 46 based on the temperature information detected by the temperature sensor 263.

A lower portion of the reaction furnace 40 is open for inserting the support member 30, and the open lower portion (a furnace port portion) is hermetically sealed as the furnace port seal cap 48 comes in contact with a lower surface of a flange of the lower end of the manifold 44 with the O-ring 50 interposed therebetween as the sealing member. For example, the furnace port seal cap 48 includes a quartz base 68 made of quartz, and a metallic base tray 70 for supporting the quartz base 68. The furnace port seal cap 48 is installed to support the support member 30 by the quartz base 68 and to be elevated together with the support member 30. A heat insulation tube 52 and a heat insulation member 152 including a plurality of heat insulation plates and a heat insulation plate holder for supporting the heat insulation plates are installed between the quartz base 68 of the furnace port seal cap 48 and the support member 30. In addition, only the heat insulation member 152 may be installed without the heat insulation tube 52 or only the heat insulation tube 52 may be installed without the heat insulation member 152. The support member 30 supports a plurality of substrates 54 held horizontally and stacked vertically having a gap therebetween in the reaction tube 42.

A gas supply port 56 and a gas exhaust port 59 are installed at the manifold 44 in integrated manner with the manifold 44. A gas introduction pipe 60 and an exhaust pipe 62 are connected to the gas supply port 56 and the gas exhaust port 59, respectively. An inner wall of the manifold 44 is disposed to be more inwardly (protrudes) than that of the reaction tube 42, a gas introduction path 64 that communicates with the gas supply port 56 and is oriented in a vertical direction is installed on a sidewall portion (a thick portion) of the manifold 44, and a nozzle installation hole is installed at an upper portion thereof so as to be open upward. In the inner part of the reaction tube 42, the nozzle installation hole is opened through an upper surface of the upper end flange of the manifold 44, and communicates with the gas supply port 56 and the gas introduction path 64. A nozzle 66 is inserted into and fixed to the nozzle installation hole. That is, in the inner part of the reaction tube 42, the nozzle 66 is connected to an upper surface of the protruding portion of the manifold 44 which is disposed more inwardly than the inner wall of the reaction tube 42. According to this configuration, a nozzle connection portion is not easily deformed and damaged by heat. In addition, the nozzle 66 and the manifold 44 may be easily assembled and disassembled. A processing gas introduced from the gas introduction pipe 60 into the gas supply port 56 is supplied into the reaction tube 42 via the gas introduction path 64 and the nozzle 66 installed on the sidewall portion of the manifold 44. In addition, the nozzle 66 is configured to extend to an upper portion of a substrate arrangement region along the inner wall of the reaction tube 42 (an upper portion of the support member 30). In addition, multiple gas introduction paths 64 and multiple nozzles 66 may be installed. In addition, the nozzle installation hole may be open toward a side of the manifold 44 instead of being open upward and an angular nozzle support may be installed as a separate device. The nozzle installation hole may then be open upward.

A gas supply pipe 232 is connected to the gas introduction pipe 60. A processing gas supply source or inert gas supply source (not shown) is connected via a mass flow controller (MFC) 241 as a gas flow rate controller to an upstream side opposite to a portion that is in contact with the gas introduction pipe 60 of the gas supply pipe 232. A gas flow rate control unit 235 is electrically connected to the MFC 241, and configured to control a flow rate of a gas to be supplied at a desired timing to have a desired gas amount.

In addition, a vacuum exhaust device 246 such as a vacuum pump is connected via a pressure sensor 245 and a pressure regulator 242 as a pressure detector to a downstream side opposite to a portion that is in contact with the manifold 44 of the exhaust pipe 62, and exhausts the processing chamber 201 such that an inner pressure of the processing chamber 201 can be adjusted to a predetermined pressure (degree of a vacuum). A pressure control unit 236 is electrically connected to the pressure regulator 242 and the pressure sensor 245, and the pressure control unit 236 is configured to control the inner pressure of the processing chamber 201 at a desired timing so that the inner pressure of the processing chamber 201 can be adjusted to a desired pressure level by the pressure regulator 242 based on the pressure detected by the pressure sensor 245.

Next, a forced cooling unit 600 for cooling a sidewall of the above-described reaction tube 42 will be described.

Figure 3:
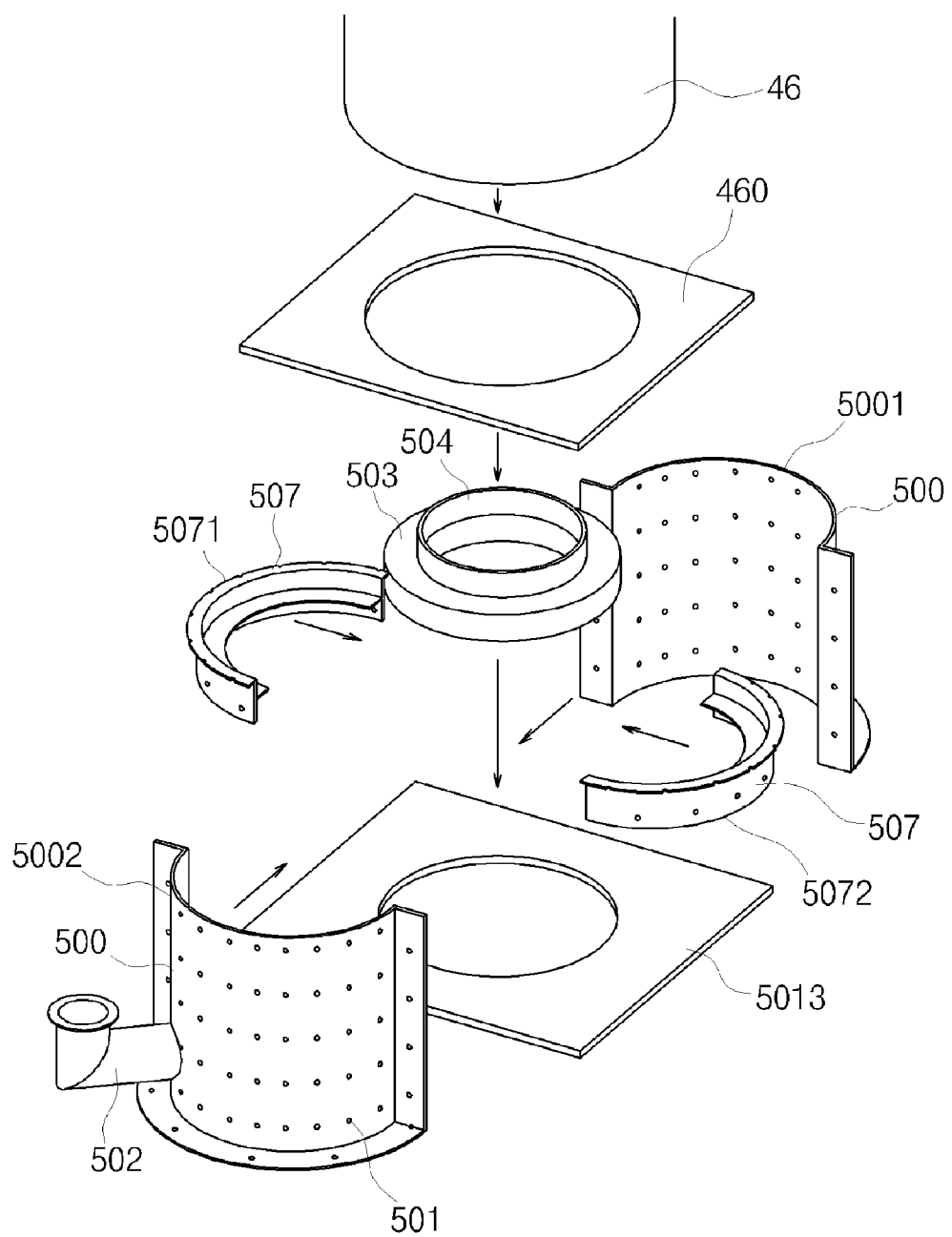
FIG. 3 is a perspective view of parts used in each of units disposed around a forced cooling unit 600.

FIG. 3 illustrates a perspective view of parts used in each of units disposed around the forced cooling unit 600.

As shown in FIGS. 2 and 3, a holder 507 for holding a first heat blocking member 503 is installed on a lower surface of a heater base 460. The holder 507 is divided into two parts having an arc shape: a first holder 5071 and a second holder 5072 and an overall shape of the holder 507 is a ring shape obtained by assembling the first holder 5071 and the second holder 5072. Each of the first holder 5071 and the second holder 5072 includes a sidewall having an upper surface formed as a flange portion, and a placement portion protruding inward from a lower end of the sidewall, and has a Z-shaped cross section. Installation holes are formed in the flange portion at a constant distance in a circumferential direction, and an installation material such as a bolt or screw is passed through the installation holes. Thereafter, the first holder 5071 and the second holder 5072 are supported as the installation holes are fixed to the lower surface of the heater base 460.

The first heat blocking member 503 is held on a placement surface of the holder 507. The first heat blocking member 503 has a cylindrical shape. An inner diameter of the first heat blocking member 503 is slightly greater than an outer diameter of the reaction tube 42. Preferably, the inner diameter of the first heat blocking member 503 is almost same as the outer diameter of the reaction tube 42. In addition, an outer diameter of the first heat blocking member 503 is slightly smaller than an inner diameter of the sidewall of the holder 507. Preferably, the outer diameter of the first heat blocking member 503 is almost same as the inner diameter of the sidewall of the holder 507.

A second heat blocking member 504 is installed in an upper surface of the first heat blocking member 503. The second heat blocking member 504 has the cylindrical shape. An inner diameter of the second heat blocking member 504 is same as that of the first heat blocking member 503. That is, the inner diameter of the second heat blocking member 504 is slightly greater than the outer diameter of the reaction tube 42. Preferably, the inner diameter of the second heat blocking member 504 is almost same as the outer diameter of the reaction tube 42. In addition, the outer diameter of the second heat blocking member 504 is smaller than the outer diameter of the first heat blocking member 503, and slightly smaller than the inner diameter of the sidewall of the heater 46. Preferably, the outer diameter of the second heat blocking member 504 is almost same as the inner diameter of the sidewall of the heater 46. The first heat blocking member 503 and the second heat blocking member 504 are made of a material selected from alumina, silica, and etc.

In addition, an upper end of the first heat blocking member 503 is disposed at least below the lowest substrate supported by the support member 30, and the heat insulation member 152 is disposed opposite to the first heat blocking member 503 and the second heat blocking member 504. The first heat blocking member 503 and the second heat blocking member 504 enables a suppression of the heat radiation from a heating zone, i.e., a substrate processing zone, of the heater 46, and simultaneously prevent an adverse effect on the heat treatment.

A surrounding member 500 is installed at a lower side of the holder 507. The surrounding member 500 is divided into two parts having a semi-arc shape: a first surrounding member 5001 and a second surrounding member 5002, and an overall shape of the entire surrounding member is a ring shape or a cylindrical shape obtained by assembling the first surrounding member 5001 and the second surrounding member 5002 The first surrounding member 5001 includes a sidewall having the arc shape, a center of which protrudes outward, a flange-shaped placement portion protruding outward from a lower end of the sidewall, and a flange-shaped contacting portion protruding outward and disposed at both side ends of the sidewall. An inner diameter of the sidewall of each of the first surrounding member 5001 and the second surrounding member 5002 is greater than the outer diameter of the sidewall of the holder 507.

Installation holes having a constant distance therebetween are disposed at an upper end of the sidewall of each of the first surrounding member 5001 and the second surrounding member 5002 in a circumferential direction, and an installation means such as a bolt or screw is passed through the installation holes. The first surrounding member 5001 and the second surrounding member 5002 are then fixed to the sidewall of the holder 507. Preferably, the surrounding member 500 is made of a metallic material, for example, stainless steel. This configuration facilitates a heat radiation from the surrounding member 500.

Installation holes having a constant distance therebetween are disposed in the replacement portions of the first surrounding member 5001 and the second surrounding member 5002 in a circumferential direction, and an installation means such as a bolt or screw is passed through the installation holes. The first surrounding member 5001 and the second surrounding member 5002 are then fixed to the upper surface of a holding base 5013.

Also, installation holes having a constant distance therebetween are disposed in a contacting portion between the first surrounding member 5001 and the second surrounding member 5002 in a vertical direction, and an installation means such as a bolt or screw is passed through the installation holes. The contacting portions are then fixed to each other. The first surrounding member 5001 and the second surrounding member 5002 are installed in the holding base 5013, and their contacting portions are fixed to each other, and the first surrounding member 5001 and the second surrounding member 5002 are then fixed to the holder 507. Therefore, a gap 506 is formed as a space between the reaction tube 42 and the surrounding member 500.

An inlet hole 501 is disposed on a sidewall of the first surrounding member 5001. Preferably, a plurality of inlet holes 501 having a constant distance therebetween may be disposed on the sidewall of the first surrounding member 5001 in a circumferential direction. Preferably, the plurality of inlet holes 501 having a constant distance therebetween may also be disposed on the sidewall of the first surrounding member 5001 in a vertical direction. More preferably, the plurality of inlet holes 501 may be disposed such that a total area thereof is smaller than that (an area excluding the total area of the multiple inlet holes) of the sidewall. Therefore, it is possible to inhale an atmosphere outside the first surrounding member 5001 (external air) through each of the inlet holes 501 at a constant gas flow rate, and cool the reaction tube 42 more uniformly.

The inlet hole 501 is disposed on the sidewall of the second surrounding member 5002. Preferably, a plurality of inlet holes 501 having a constant distance therebetween may be disposed on the sidewall of the second surrounding member 5002 in a circumferential direction. Preferably, the plurality of inlet holes 501 having a constant distance therebetween may also be disposed on the sidewall of the second surrounding member 5002 in a vertical direction. Preferably, the plurality of inlet holes 501 may also be formed such that the total opening area is smaller than the total area (the total area excluding the opening area of the inlet holes) of the sidewall. Therefore, it is possible to inhale an atmosphere (the air) outside the second surrounding member 5002 through each of the inlet holes 501 at a constant gas flow rate, and cool the reaction tube 42 more uniformly.

Preferably, the surrounding member 500 may be configured such that a length thereof in a longitudinal direction of the gap 506 (a vertical direction in FIG. 2) is greater than a width thereof in a transverse direction (a horizontal direction in FIG. 2). This configuration facilitates the atmosphere inhaled through the inlet holes 501 to collide with the sidewall of the reaction tube 42, thereby further facilitating the cooling of the sidewall of the reaction tube 42.

Preferably, the surrounding member 500 may also be configured such that outer diameter thereof is smaller than an outer diameter of the heater 46. This configuration facilitates the atmosphere inhaled through the inlet holes 501 to collide with the sidewall of the reaction tube 42, thereby further facilitating the cooling of the sidewall of the reaction tube 42. Further, this configuration suppresses an increase in an installation space of the surrounding member 500, an increase in a dead space or an increase in a size of the heat treatment apparatus 10. Preferably, the surrounding member 500 may also be configured such that an inner diameter thereof does not exceed an inner diameter of the heater 46. This configuration facilitates the atmosphere inhaled through the inlet holes 501 to collide with the sidewall of the reaction tube 42, thereby further facilitating the cooling the sidewall of the reaction tube 42. Further, this configuration suppresses an increase in an installation space of the surrounding member 500, the increase in the dead space or the increase in the size of the heat treatment apparatus 10.

An exhaust port 5021 is installed on the sidewall of the second surrounding member 5002, and an exhaust pipe 502 is connected to the exhaust port 5021. Preferably, the exhaust port 5021 may be installed below the sidewall of the second surrounding member 5012, and configured such that the inlet holes 501 are provided in portion higher than the exhaust port 5021. This configuration facilitates the cooling of surroundings of the exhaust port 5021 due to the high gas flow velocity. However, since the exhaust port 5021 is installed below the sidewall of the second surrounding member 5012, a generation of an excessive stress into the reaction tube 42 by a difference in temperature, which is caused by sudden cooling of the reaction tube 42 heated in the heating zone of the heater 46, may be suppressed. In addition, since the atmosphere flowing in the gap 506 may flow away from the heater 46, the heat radiation from a heating zone, i.e., a substrate processing zone, of the heater 46, as well as an adverse effect on the heat treatment, may be suppressed. More preferably, the number of the inlet holes 501 on the sidewall of the second surrounding member 5012 disposed in the upper portion of the exhaust port 5021 is greater than that of the inlet holes 501 disposed in the lower portion of the exhaust port 5021. This configuration suppresses the generation of an excessive stress into the reaction tube 42 by the difference in temperature, which is caused by sudden cooling of the reaction tube 42 heated in the heating zone of the heater 46.

Also, since the exhaust port 5021 is installed in the second surrounding member 5012 and the inlet holes 501 are disposed in the first surrounding member 5001, a constant gas (atmosphere) flow into the gap 506 may be secured even when the inlet holes 501 are not installed on the sidewall of the second surrounding member 5002 to have a uniform effect.

An exhaust duct 5022 is connected to the exhaust pipe 502. A cooling device 300 for cooling a gas and an exhaust device 301 for forcibly exhausting the gap 506 and simultaneously adjusting a quantity of the gas exhausted from the exhaust port 5021 is installed in the exhaust duct 5022. An exhaust line is configured by the exhaust pipe 502, the exhaust duct 5022, etc.

An exhaust blower and the like, for example, are used as the exhaust device 301. The exhaust device 301 is electrically connected to an exhaust volume controller 237, and is configured to control a temperature of a lower portion of the reaction tube 42 at a desired timing to have a desired temperature distribution by adjusting an electrification state to the exhaust device 301 or a frequency based on a pre-set desired timing or the temperature information detected by the temperature sensor 263.

Preferably, the exhaust volume controller 237 is configured to control the exhaust device 301 in order to at least forcibly exhaust the gap 506 while the heater 46 heats an inner part of the reaction tube 42 to a temperature equal to or higher than a heat treatment temperature of the substrate. Preferably, it is desirable to configure the exhaust volume controller 237 to control the exhaust device 301 in order to at least forcibly exhaust the gap 506 and maintain a lower portion of the heater 46 of the reaction tube 42 at a temperature equal to or lower than a predetermined temperature while the heater 46 heats the inner part of the reaction tube 42 to a temperature equal to or higher than the heat treatment temperature of the substrate.

The gas flow rate control unit 235, the pressure control unit 236, the exhaust volume controller 237, and the temperature controller 238 also include a manipulation unit and an input/output unit, and are electrically connected to a main control unit 239 for controlling an entirety of the heat treatment apparatus 10. The gas flow rate control unit 235, the pressure control unit 236, the exhaust volume controller 237, the temperature controller 238, and the main control unit 239 constitute a controller 240.

Next, an operation of the heat treatment apparatus 10 described above will be described in detail. In the following description, operations of parts constituting the substrate processing apparatus are controlled by the controller 240.

First, when the pod 16 in which a plurality of substrates are accommodated is set on the pod stage 14, the pod 16 is transferred from the pod stage 14 to the pod shelf 20 by means of the pod transfer device 18, and stocked in the pod shelf 20. Thereafter, the pod 16 stocked in the pod shelf 20 is transferred to the pod opener 22 and set by the pod transfer device 18. Thereafter, the pod opener 22 opens the lid of the pod 16, and the substrate number detector 24 detects the number of substrates accommodated in the pod 16.

Thereafter, the substrate transfer unit 26 extracts the substrate from the pod 16 placed on the pod opener 22, and transfers the substrate to the notch aligner 28. The notch aligner 28 detects a notch while rotating the substrate and aligns the notches of a plurality of substrates in the same position based on the detected information. Thereafter, the substrate transfer unit 26 extracts the substrates from the notch aligner 28 and transfers the substrates to the support member 30.

When the substrates of one batch are transferred to the support member 30 as described above, the support member 30 loaded with the plurality of substrates is charged (loaded) into the reaction furnace 40 whose temperature is, for example, set to approximately 600° C., and the reaction furnace 40 is hermetically sealed by the furnace port seal cap 48 (substrate loading process). Thereafter, a processing gas is introduced into the reaction tube 42 from the gas introduction pipe 60 via the gas introduction port 56 and the gas introduction path 64 and the nozzle 66 which are installed on a sidewall portion of the manifold 44 while increasing an inner temperature of the reaction furnace 40 to reach a heat treatment temperature, and the substrate in the reaction furnace 40 is subjected to heat treatment (heat treatment process). The processing gas includes nitrogen ($N_2$), argon (Ar), hydrogen ($H_2$), oxygen ($O_2$), hydrogen chloride (HCl), dichloroethylene ($C_2H_2Cl_2$, abbreviated as "DCE") and the like. When the substrate is subjected to the heat treatment, the substrate is heated, for example, to a temperature of approximately 1100° C. or higher.

When the heat treatment of the substrate is completed, the inner temperature of the reaction furnace is lowered to a temperature of approximately 600° C., and the support member 30 which supports the substrate that underwent the heat treatment is unloaded (discharged) from the reaction furnace 40. Until an entirety of the substrates supported by the support member 30 are cooled, the support member 30 is maintained in a predetermined position (substrate unloading process). Thereafter, when the substrate of the support member 30 which is in a waiting state is cooled to the predetermined temperature, the substrate transfer unit 26 extracts the substrate from the support member 30, and transfers the substrate to the empty pod 16 set on the pod opener 22 to accommodate the substrate. Thereafter, the pod transfer device 18 transfers the pod 16 accommodating the substrate to the pod shelf 20 or the pod stage 14 to complete the process.

However, in order to enable the treatment in the processing chamber 201 at a high temperature of 1100° C. or higher, the reaction tube 42 made of quartz is preferable according to the frequency and time of use. However, the reaction tube 42 is preferably made of SiC to improve a heat resistance thereof. For example, the use of the reaction tube 42 made of the SiC material is problematic in that, the O-ring 150, which is a sealing material, may melt in a structure wherein the manifold 44 is sealed via the O-ring 150 as the O-ring 150 is heated to a high temperature by the heat transferred via the SiC reaction tube having a high thermal conductivity. In addition, when a sealing portion of the SiC reaction tube 42 only is suddenly cooled to prevent the melting of the O-ring 150, the SiC reaction tube 42 may be damaged by the difference in thermal expansion caused by the difference in temperature. Therefore, when the heat treatment is performed at a high temperature of at least 1100° C., the exhaust device 301 is operated to forcibly exhaust the gap 506 from the exhaust port 5021 via the exhaust duct 5022 and the exhaust pipe 502 in accordance with the embodiment, and an atmosphere outside the surrounding member 500 is inhaled into the exhausted gap 506 through the plurality of inlet holes 501. As a result, it is possible to cool the sidewall of the reaction tube 42 arranged in a lower portion than the heater 46, as well as the sealing portion of the reaction tube 42, and also slow down the transfer of heat from the reaction tube 42 heated by the heater 46 and seal a space between the reaction tube 42 and the manifold 44 without melting the O-ring 150 and damaging the reaction tube 42. Further, since the first heat blocking member 503 and the second heat blocking member 504 are provided, it is possible to suppress the heat radiation from the heating zone, i.e., the substrate processing zone, of the heater 46 as well as the adverse effect on the heat treatment.

According to the embodiment of the present invention, at least one of the following effects is achieved.

1) It is possible to process a substrate at a high temperature of 1100° C. or higher. In particular, it is possible to realize the heat treatment at a high temperature of 1400° C. or higher. In addition, the heat resistance may be further improved by forming a reaction tube of a porous SiC material.

2) When the substrate is processed at the high temperature, a lower portion of the reaction tube may be rapidly cooled as the atmosphere is forcibly exhausted by the exhaust device.

3) Since the heat treatment apparatus includes the reaction tube for processing the substrate, the manifold for supporting the reaction tube, the heater installed around the reaction tube to heat an inner part of the reaction tube, the surrounding member installed to surround the side portion of the reaction tube arranged in the lower portion than the heater, the exhaust device for forcibly exhausting the gap between the surrounding member and the reaction tube, and the sealing member installed in the contacting portion between the reaction tube and the manifold, and the inlet hole through which the exhaust device inhales the atmosphere outside the surrounding member into the gap is installed in the surrounding member, it is possible to shorten the region below the heater. That is, it is possible to suppress the height of the heat treatment apparatus, enlarge the substrate processing zone and increase the number of substrates that may be processed in one batch.

4) When a cooling gas is ejected onto the reaction tube, it is difficult to uniformly cool the reaction tube in the circumferential direction thereof because a supply rate is limited. However, when the gap is exhausted from the exhaust port while simultaneously inhaling through the inlet hole to the gap, the exhaust rate is possible and the reaction tube may be cooled more uniformly in a circumferential direction thereof, compared to the supply rate.

5) When the substrate is processed at a high temperature, a zone other than the substrate processing zone is also at the high temperature.

In this case, the members constituting the processing chamber should be maintained at a heat-resistant temperature thereof or lower, and it is necessary to install a heat insulation zone. However, a long heat insulation zone may be required to cool the processing chamber to the heat-resistant temperature or lower. In such case, as long as there is a limit in a height of the apparatus, the processing zone is inevitably shortened, and the number of the substrate that can be processed is reduced. By dividing the processing zone and the heat insulation zone, surrounding the heat insulation zone in a lower portion of the heating zone, forcing air to flow from the surrounded exhaust line into an inner part of the surrounded exhaust line using a blower and the like, depriving the heat of the heat insulation zone of the air, and removing the heat of the heat insulation zone with the air, the heat insulation zone may be shortened and the processing zone may be elongated.

6) When the substrate is heated in the substrate heating zone, the high heat is transferred to a lower portion of the processing apparatus, and the heat insulation zone is heated to the high temperature. As the heat insulation zone is heated the high temperature, the member constituting the heat insulation zone is heated to the high temperature, thereby exceeding the heat-resistant temperature. In order to solve this problem, the circumference of a metallic material may, for example, be installed in the heat insulation zone, and an atmosphere may be exhausted through an inner part of the circumference using the blower and the like. Therefore, it is possible to remove a heat energy accumulated in the circumference, and simultaneously lower the temperature.

7) When the exhaust port disposed in the surrounding member is installed below the sidewall of the surrounding member, and the inlet hole is provided above the exhaust port, the cooling of the surroundings of the exhaust port is facilitated due to a rapid flow velocity of gas. However, when the exhaust port is installed below the sidewall of the surrounding member, the generation of an excessive stress into the reaction tube by the difference in temperature, which is caused by the sudden cooling of the reaction tube heated in the heating zone of the heater, is suppressed. In addition, since the atmosphere flowing through the gap may be directed away from the heater, the heat radiation from the heating zone, i.e., the substrate processing zone, of the heater 46 as well as the adverse effect on the heat treatment may be suppressed.

Example 1

The heat treatment apparatus according to the above-described embodiment was used to measure a thermal effect on the surroundings of a contacting portion between the reaction tube 42 and the manifold 44 under the following processing conditions in which the temperature of the processing chamber 201 was changed while maintaining a constant exhaust speed using the exhaust device 301. As a result, following temperature measurement results were obtained.

Processing Conditions: inner temperature (substrate processing temperature) of the processing chamber 201 was set to 1000° C. and the frequency of the exhaust device 301 (blower) was set to 30 Hz.

Temperature measured in the surroundings of the contacting portion between the reaction tube 42 and the manifold 44 was 124° C.

Processing Conditions: inner temperature (substrate processing temperature) of the processing chamber 201 was set to 1100° C. and the frequency of the exhaust device 301 (a blower) was set to 30 Hz.

Temperature measured in the surroundings of the contacting portion between the reaction tube 42 and the manifold 44 was 151° C.

Processing Conditions: inner temperature (substrate processing temperature) of the processing chamber 201 was set to 1200° C. and the frequency of the exhaust device 301 (a blower) was set to 30 Hz.

Temperature measured in the surroundings of the contacting portion between the reaction tube 42 and the manifold 44 was 182° C.

Processing Conditions: inner temperature (substrate processing temperature) of the processing chamber 201 was set to 1300° C. and the frequency of the exhaust device 301 (a blower) was set to 30 Hz.

Temperature measured in the surroundings of the contacting portion between the reaction tube 42 and the manifold 44 was 200° C.

From these results, it can be seen that, when it is assumed that a set frequency of the exhaust device 301 (a blower) is 30 Hz and the gap 506 is forcibly exhausted from the exhaust device 301, the temperature of the surroundings of the contacting portion between the reaction tube 42 and the manifold 44 was 260° C. even when the inner temperature (substrate processing temperature) of the processing chamber 201 was 1400° C., thereby suppressing the deterioration of the O-ring through the use of the sealing member, for example, the O-ring having heat resistance of approximately 300° C.

Example 2

The heat treatment apparatus according to the above-described embodiment was used to measure the thermal effect on the surroundings of the contacting portion between the reaction tube 42 and the manifold 44 under the following processing conditions in which an exhaust speed was changed using the exhaust device 301 while maintaining a constant temperature of the processing chamber 201. As a result, following temperature measurement results were obtained.

1) Processing Conditions: inner temperature (substrate processing temperature) of the processing chamber 201 was set to 1250° C. and the frequency of the exhaust device 301 (blower) was set to 20 Hz.

Temperature measured in the surroundings of the contacting portion between the reaction tube 42 and the manifold 44 was 237° C.

Processing Conditions: inner temperature (substrate processing temperature) of the processing chamber 201 was set to 1250° C. and the frequency of the exhaust device 301 (blower) was set to 30 Hz.

Temperature measured in the surroundings of the contacting portion between the reaction tube 42 and the manifold 44 was 200° C.

Processing Conditions: inner temperature (substrate processing temperature) of the processing chamber 201 was set to 1250° C. and the frequency of the exhaust device 301 (blower) was set to 40 Hz.

Temperature measured in the surroundings of the contacting portion between the reaction tube 42 and the manifold 44 was 165° C.

From these results, it can be seen that the temperature of the surroundings of the contacting portion between the reaction tube 42 and the manifold 44 may be lowered as the set frequency of the exhaust device 301 (blower) is increased.

Example 3

The heat treatment apparatus according to the above-described embodiment was used to measure the thermal effects on the surroundings of an overlapping height of the gap 506 between the reaction tube 42 and the manifold 44 and on multiple positions with the exhaust port 5021 in the circumferential direction of the reaction tube 42 under the following processing conditions in which an exhaust speed was changed using the exhaust device 301 while maintaining the temperature of the processing chamber 201 constant. As a result, following temperature measurement results were obtained.

1) Processing Conditions: inner temperature (substrate processing temperature) of the processing chamber 201 was set to 1200° C. and the frequency of the exhaust device 301 (blower) was set to 20 Hz.

Temperature measured in a position spaced apart approximately 90° from the exhaust port 5021 in the circumferential direction of the reaction tube 42 was 450° C.

Temperature measured in a position spaced apart approximately 180° from the exhaust port 5021 in a circumferential direction of the reaction tube 42 was 438° C.

Processing Conditions: inner temperature (substrate processing temperature) of the processing chamber 201 was set to 1200° C. and the frequency of the exhaust device 301 (blower) was set to 40 Hz.

Temperature measured in a position spaced apart approximately 90° from the exhaust port 5021 in a circumferential direction of the reaction tube 42 was 374° C.

Temperature measured in a position spaced apart approximately 180° from the exhaust port 5021 in a circumferential direction of the reaction tube 42 was 373° C.

From these results, it can be seen that the temperature uniformity in the gap 506 may be improved in the circumferential direction of the reaction tube 42 as the frequency of the exhaust device 301 (blower) is increased.

A second embodiment of the present invention will be described in detail.

Figure 4:
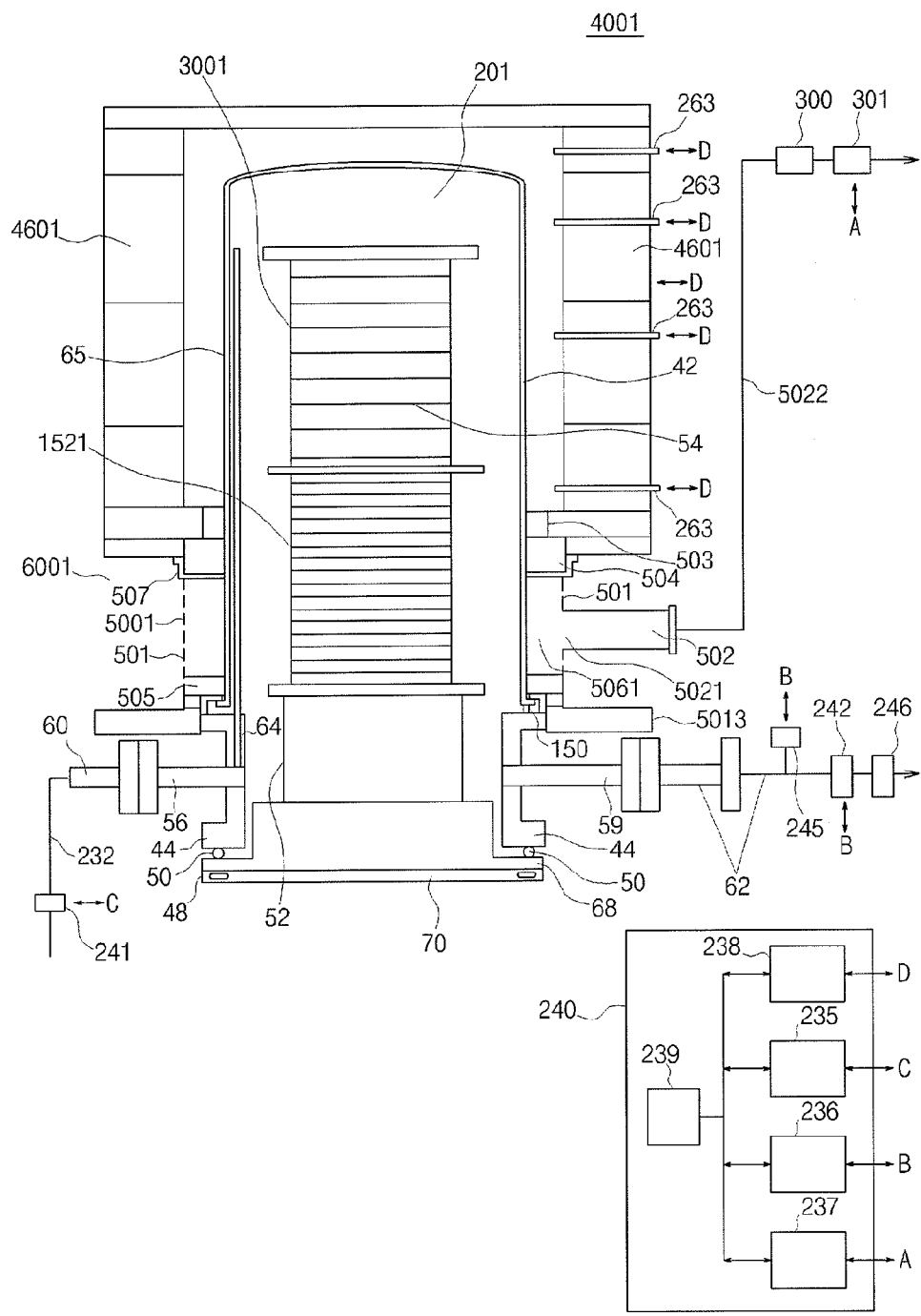
FIG. 4 is a longitudinal cross-sectional view illustrating a reaction furnace used in a second embodiment of the present invention.

FIG. 4 exemplifies a reaction furnace 4001 according to a second embodiment of the present invention. As shown in FIG. 4, the second embodiment differs from the first embodiment in lengths of a support member 3001, a heat insulation member 1521, a heater 4601, and a forced cooling unit 6001, a surrounding member 5001 and the gap 5061 in lengthwise directions thereof, and in that a third heat blocking member 505 is additionally installed. However, components of the second embodiment are identical to those of the first embodiment except for the above-described components.

It is preferable when more substrates 54 can be thermally processed in one batch. In accordance with the second embodiment, more substrates 54 can be thermally processed in one batch while an overall height of the reaction furnace 4001 remains the same as that of the first embodiment. That is, the heater 4601 and the support member 3001 are elongated in the lengthwise direction thereof, and the number of the substrates 54 supported by the support member 3001 is increased. In addition, the heat insulation member 1521 is shortened in the lengthwise direction thereof, and the surrounding member 5001 and the gap 5061 constituting the forced cooling unit 6001 are shortened in the lengthwise direction thereof. In accordance with the second embodiment, since a volume of the gap 5061 is or the number of the inlet holes 501 of the surrounding member 5001 is decreased, a forced cooling ability is further degraded compared to the first embodiment and a possibility of a deterioration of the O-ring 150 is higher. Therefore, in accordance with the second embodiment, the third heat insulation member 505 is disposed immediately above the contacting portion between the reaction tube 42 and the manifold 44 so as to reduce the possibility of deterioration of the O-ring 150.

The third heat blocking member 505 has a cylindrical shape. An inner diameter of the third heat blocking member 503 is slightly greater than the outer diameter of the reaction tube 42. Preferably, the inner diameter of the third heat blocking member 503 is almost same as the outer diameter of the reaction tube 42. In addition, an outer diameter of the third heat blocking member 505 is slightly smaller than the inner diameter of a sidewall of the surrounding member 5001. Preferably, the outer diameter of the third heat blocking member 505 503 is almost same as the inner diameter of the sidewall of the surrounding member 5001.

By above-described configuration, the sidewall of the reaction tube 42 disposed lower than the heater 46 as well as the sealing portion of the reaction tube 42 may be cooled, and also slow down the heat transfer from the reaction tube 42 heated by the heater 46, and a space between the reaction tube 42 and the manifold 44 may be sealed without melting the O-ring 150 and damaging the reaction tube 42.

Another embodiment of the present invention will be described hereinafter.

The first heat blocking member 503 is supported by a placement surface of the holder 507. The first heat blocking member 503 has a cylindrical shape. The inner diameter of the first heat blocking member 503 is slightly greater than the outer diameter of the reaction tube 42. Preferably, the inner diameter of the first heat blocking member 503 is almost same as the outer diameter of the reaction tube 42. In addition, the outer diameter of the first heat blocking member 503 is slightly smaller than the inner diameter of the sidewall of the holder 507. Preferably, the outer diameter of the first heat blocking member 503 is almost same as the inner diameter of the sidewall of the holder 507.

While the holder 507, the first heat blocking member 503, and the second heat blocking member 504 are installed in accordance with above-described embodiment, same effect can be provided without the holder 507, the first heat blocking member 503, and the second heat blocking member 504. In such case, an upper end of the surrounding member 500 may be directly fixed to a lower surface of the heater base 460. In addition, the holder 507, the first heat blocking member 503 and the second heat blocking member 504 may be exchanged with a heat insulation member, and the heat insulation member may be configured to protrude from a lower end of the heater 46 toward the reaction tube 42. In such case, the exchange operation is difficult to perform since a gap between the heat insulation member of the heater 46 and the reaction tube 42 disappears, or heat blocking ability may be degraded since only a narrow gap exists between the lower heat insulation member of the heater 46 and the reaction tube 42. However, this may have a certain effect in that it has the same effect as the present invention.

While the O-ring 150 as the sealing member is installed in the contacting portion between the reaction tube 42 and the manifold 44 installed in accordance with above-described embodiment, it is preferable to install an O-ring, which is made of a polymeric material as the sealing member, in the contacting portion between the reaction tube 42 and the manifold 44 when a process of maintaining a pressure of the processing chamber 201 at a vacuum state or a reduced pressure state of no less than 10 Pa and no more than 1000 Pa is included. However, but the present invention is not particularly limited thereto. For example, a flat ring made of the polymeric material may constitute as the sealing member, and the contacting portion may be hermetically sealed by a metallic material.

While the exhaust device 301 is connected via the cooling device 300 in accordance with above-described embodiment, the present invention is not particularly limited thereto. When the exhaust device 301 is hardly or not exposed to a thermal deterioration, the cooling device 300 is not required. While the surrounding member 500 is divided into two parts such as the first surrounding member 5001 and the second surrounding member 5002 in accordance with above-described embodiment, the present invention is not particularly limited thereto. For example, the first surrounding member 5001 and the second surrounding member 5002 may be integrated with each other or the surrounding member 500 may be divided into at least three parts.

Also, while the reaction tube 42 is made of a SiC material in accordance with above-described embodiment of the present invention, a solid SiC or a porous SiC may be used as the SiC material. In addition, the SiC material may include a silicone encapsulant, a sintering agent or a combination thereof, and may also be coated using a CVD coating process. In addition, a material such as silicone and quartz may be used for the reaction tube 42.

The present invention may be applied to one of processes of manufacturing a separation-by-implanted-oxygen (SIMOX) wafer which is a silicon-on-insulator (SOI) wafer.

That is, in the SIMOX, oxygen ions are first injected into a single crystalline silicon wafer using an ion implanter, etc. Thereafter, the oxygen ion-implanted wafer is annealed at a high temperature of 1300° C. to 1400° C., for example, 1350° C. or higher under an Ar/O2 atmosphere, for example, using the heat treatment apparatus according to the embodiment. The SIMOX wafer in which a $SiO_2$ layer is formed inside a wafer is manufactured by these treatment processes.

In addition to the SIMOX wafer, the present invention may be applied to one of processes of manufacturing a hydrogen-annealed wafer. In this case, a wafer is annealed at a high temperature of 1200° C. or higher under a hydrogen atmosphere using the heat treatment apparatus according to the present invention. Therefore, it is possible to reduce crystal defects in a surface of the wafer on which integrated circuits are formed, and enhance the crystal integrity.

In addition, the present invention may also be applied to one of processes of manufacturing an epitaxial wafer.

While a material such as SiC, silicone, sapphire and quartz are used as the substrate, the present invention is not particularly limited thereto. In addition, the substrate not limited to the wafer, and may include a photomask or a printed circuit board, a liquid crystal panel, a compact disc, and a magnetic disc.

The semiconductor manufacturing apparatus may be used for the heat treatment such as formation of an oxide film or diffusion treatment without limiting to a CVD device used for film formation.

Even when a high-temperature annealing process is performed as one of the processes of manufacturing the substrate as described above, the present invention may be used to achieve the high-accuracy processing and the high safety.

The present invention may be preferably applied to a process of manufacturing a semiconductor device. In particular, the present invention may be applied to a heat treatment process performed at a relatively high temperature, for example, a thermal oxidation process such as wet oxidation, dry oxidation, hydrogen combustion oxidation (pyrogenic oxidation), HCl oxidation, nitrogen monoxide (NO) oxidation, nitrogen dioxide ($N_2O$) oxidation, or low pressure oxidation, or a thermal diffusion process of diffusing impurities (a dopant) such as boron (B), phosphorus (P), arsenic (As), or antimony (Sb) into a semiconductor thin film.

Even when the heat treatment process is performed as one of the processes of manufacturing a semiconductor device, the present invention may be used to achieve high-accuracy processing and high safety.

Hereinafter, the preferred embodiments of the present invention will be described in detail.

A first embodiment of the present invention provides a heat treatment apparatus including: a reaction tube for processing a substrate; a manifold for supporting the reaction tube; a heater installed about the reaction tube to heat an inner part of the reaction tube; a surrounding member installed to surround a side portion of the reaction tube lower than the heater; an exhaust device for forcibly exhausting a gap between the surrounding member and the reaction tube; and a sealing member installed at a contacting portion between the reaction tube and the manifold, wherein an inlet hole is installed at the surrounding member, and the exhaust device inhales an atmosphere outside the surrounding member into the gap through the inlet hole.

Preferably, a controller for controlling the exhaust device is provided to forcibly exhaust the gap while the heater heats an inner part of the reaction tube to a temperature equal to or higher than a heat treatment temperature of the substrate.

Preferably, a controller for controlling the exhaust device is also provided to forcibly exhaust the gap to maintain a lower portion of the heater of the reaction tube at a temperature equal to or lower than a predetermined temperature while the heater heats an inner part of the reaction tube to a temperature equal to or higher than the heat treatment temperature of the substrate.

Preferably, the heat treatment temperature of the substrate is 1200° C. or higher.

Preferably, a second exhaust device for exhausting an inner part of the reaction tube is provided, and a controller controls the second exhaust device so that an inner part of the reaction tube can be maintained at a reduced pressure when the substrate is processed in the reaction tube.

Preferably, the reaction tube is made of a SiC material.

Preferably, the surrounding member is made of a metallic material.

Preferably, the inlet hole is installed in the exhaust device in a manner that the number of the inlet holes 501 disposed in the upper portion of the exhaust port to which the surrounding member is connected is greater than that of the inlet holes 501 disposed in the lower portion of the exhaust port.

A second embodiment of the present invention a method of manufacturing a semiconductor device, including: (a) loading a substrate into a reaction tube supported by a manifold; (b) thermally treating the substrate in the reaction tube; and (c) unloading the substrate from the reaction tube after the step (b), wherein a contacting portion between the reaction tube and the manifold is hermetically sealed by a sealing member, a surrounding member surrounding a side portion of the reaction tube is installed, an inlet hole is installed at the surrounding member, and an atmosphere between the reaction tube and the surrounding member is forcibly exhausted and inhaled through the inlet hole into the gap at least during the step (b).

What is claimed is:

1. A heat treatment apparatus comprising:
a reaction tube configured to process a substrate;
a manifold supporting the reaction tube;
a heater configured to heat the reaction tube and surrounding an upper portion of the reaction tube;
a surrounding member disposed below the heater and surrounding a lower portion of the reaction tube
with a gap therebetween, the surrounding member comprising a plurality of inlet holes disposed at a side surface thereof;
an exhaust device configured to exhaust the gap such that air outside the surrounding member flows into the gap through the inlet holes and then flows out of the gap through an exhaust pipe; and
a sealing member disposed at a contacting portion between the reaction tube and the manifold.

2. The heat treatment apparatus according to claim 1, further comprising the exhaust pipe connecting the surrounding member and the exhaust device.

3. The heat treatment apparatus according to claim 1, further comprising a first heat blocking member disposed between the heater and the surrounding member.

4. The heat treatment apparatus according to claim 3, further comprising a second heat blocking member disposed between the heater and the first heat blocking member.

5. The heat treatment apparatus according to claim 1, wherein the surrounding member further comprises an exhaust port disposed at the side surface thereof,
wherein the plurality of inlet holes are arranged in a circumferential direction in a manner that number of the inlet holes located higher than the exhaust port is greater than number of the inlet holes located lower than the exhaust port, and wherein the exhaust device draws the air outside the surrounding member into the gap through the plurality of inlet holes.

6. A heat treatment apparatus comprising:

a reaction tube configured to process a substrate;

a manifold supporting the reaction tube;

a heater configured to heat the reaction tube and surrounding an upper portion of the reaction tube;

a surrounding member surrounding a side portion of the reaction tube below the heater;

an exhaust device configured to exhaust a gap between the surrounding member and the reaction tube; and a sealing member disposed at a contacting portion between the reaction tube and the manifold, wherein the surrounding member comprises an exhaust port and a plurality of inlet holes disposed at a side surface thereof, the plurality of inlet holes being arranged in a circumferential direction in a manner that number of the inlet holes located higher than the exhaust port is greater than number of the inlet holes located lower than the exhaust port, and wherein the exhaust device draws an air outside the surrounding member into the gap through the plurality of inlet holes.

* * * * *